United States Patent
Shimizu et al.

(10) Patent No.: US 9,741,798 B2
(45) Date of Patent: Aug. 22, 2017

(54) SEMICONDUCTOR DEVICE

(71) Applicant: Kabushiki Kaisha Toshiba, Minato-ku (JP)

(72) Inventors: Tatsuo Shimizu, Tokyo (JP); Takashi Shinohe, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/871,053

(22) Filed: Sep. 30, 2015

(65) Prior Publication Data

US 2016/0020282 A1 Jan. 21, 2016

Related U.S. Application Data

(63) Continuation of application No. 13/957,603, filed on Aug. 2, 2013, now Pat. No. 9,178,052.

(30) Foreign Application Priority Data

Sep. 26, 2012 (JP) .................................. 2012-212885

(51) Int. Cl.
*H01L 29/16* (2006.01)
*H01L 29/423* (2006.01)
(Continued)

(52) U.S. Cl.
CPC ........ *H01L 29/1608* (2013.01); *H01L 21/049* (2013.01); *H01L 21/0465* (2013.01);
(Continued)

(58) Field of Classification Search
CPC .. H01L 29/1608; H01L 21/0465; H01L 27/04
(Continued)

(56) References Cited

U.S. PATENT DOCUMENTS 6,972,436 B2* 12/2005 Das .................. H01L 21/045
257/411
2005/0258474 A1* 11/2005 Tanaka .................. G11C 16/30
257/316
(Continued)

FOREIGN PATENT DOCUMENTS

JP 62-33469 A 2/1987
JP 2004-193288 A 7/2004
(Continued)

OTHER PUBLICATIONS

Office Action issued on Dec. 22, 2015 in Japanese Patent Application No. 2014-212885 with English translation.
(Continued)

*Primary Examiner* — Moazzam Hossain
(74) *Attorney, Agent, or Firm* — Oblon, McClelland, Maier & Neustadt, L.L.P.

(57) ABSTRACT

According to one embodiment, a semiconductor device includes a structure, an insulating film, a control electrode, first and second electrodes. The structure has a first surface, and includes a first, a second, and a third semiconductor region. The structure has a portion including the first, second, and third semiconductor regions arranged in a first direction along the first surface. The insulating film is provided on the first surface. The control electrode is provided on the insulating film. The first electrode is electrically connected to the third semiconductor region. The second electrode is electrically connected to the first semiconductor region. The insulating film includes a charge trap region. A bias voltage is applied to the first and second electrodes, and includes a shift voltage. The shift voltage shifts a reference potential of a voltage applied to the first and second electrodes by a certain voltage.

13 Claims, 8 Drawing Sheets

(51) Int. Cl.
*H01L 29/51* (2006.01)
*H01L 29/78* (2006.01)
*H01L 21/04* (2006.01)
*H01L 27/04* (2006.01)
*H01L 29/66* (2006.01)
*H01L 29/792* (2006.01)
*H01L 29/739* (2006.01)

(52) U.S. Cl.
CPC .......... *H01L 29/4234* (2013.01); *H01L 29/51* (2013.01); *H01L 29/513* (2013.01); *H01L 29/517* (2013.01); *H01L 29/518* (2013.01); *H01L 29/66068* (2013.01); *H01L 29/7395* (2013.01); *H01L 29/78* (2013.01); *H01L 29/7802* (2013.01); *H01L 29/7827* (2013.01); *H01L 29/792* (2013.01)

(58) Field of Classification Search
USPC .......................................................... 257/77
See application file for complete search history.

(56) References Cited

U.S. PATENT DOCUMENTS

| | | | |
|---|---|---|---|
| 2006/0267072 A1* | 11/2006 | Bhattacharyya | H01L 29/4232 257/315 |
| 2007/0026243 A1* | 2/2007 | Iwanaga | C23C 16/308 428/446 |
| 2007/0048957 A1 | 3/2007 | Lee et al. | |
| 2007/0126045 A1* | 6/2007 | Choi | H01G 7/06 257/310 |
| 2008/0023744 A1* | 1/2008 | Shin | H01L 21/28282 257/298 |
| 2008/0042192 A1* | 2/2008 | Park | H01L 29/4234 257/324 |
| 2008/0217680 A1 | 9/2008 | Shimizu et al. | |
| 2008/0237688 A1* | 10/2008 | Yasuda | H01L 21/28282 257/316 |
| 2009/0096738 A1* | 4/2009 | Chen | G09G 3/3692 345/98 |
| 2009/0134467 A1* | 5/2009 | Ishida | H01L 21/26506 257/368 |
| 2010/0052040 A1 | 3/2010 | Kohno et al. | |
| 2010/0221905 A1* | 9/2010 | Hautala | H01L 21/28273 438/591 |
| 2011/0260239 A1 | 10/2011 | Oyu | |
| 2012/0018743 A1 | 1/2012 | Hiyoshi et al. | |
| 2012/0146148 A1* | 6/2012 | Iwamatsu | H01L 27/1207 257/351 |
| 2013/0256747 A1 | 10/2013 | Sin et al. | |

FOREIGN PATENT DOCUMENTS

| | | |
|---|---|---|
| JP | 2007-67412 A | 3/2007 |
| JP | 2008-91421 A | 4/2008 |
| JP | 2008-270258 A | 11/2008 |
| JP | 2011-243948 A | 12/2011 |
| JP | 2012-49491 A | 3/2012 |
| WO | 2008/117798 A1 | 10/2008 |
| WO | 2014/010006 A1 | 1/2014 |

OTHER PUBLICATIONS

Shuhei Tanakamaru et al. "A 0.5V Operation, 32% Lower Active Power, 42% Lower Leakage Current, Ferroelectric 6T-SRAM with $V_{th}$ Self-Adjusting Function for 60% Larger Static Noise Margin", IEDM Tech. Dig., 2009, 4 pages.
Office Action issued Jul. 30, 2014 in Japanese Patent Application No. 2012-212885.
Ma et al—Fixed and trapped charges at oxide-nitride-oxide heterostructure interfaces formed by remote plasma enchanced chemical vapor deposition J Vac Sci Technol B11-.
Office Action issued on Jul. 25, 2016 in Japanese Patent Application No. 2014-212885 with unedited computer generated English translation.

* cited by examiner

SEMICONDUCTOR DEVICE

CROSS-REFERENCE TO RELATED APPLICATIONS

This application is a continuation of U.S. application Ser. No. 13/957,603, filed on Aug. 2, 2013, and is based upon and claims the benefit of priority from Japanese Patent Application No. 2012-212885, filed on Sep. 26, 2012; the entire contents of which are incorporated herein by reference.

FIELD

Embodiments described herein relate generally to a semiconductor device.

BACKGROUND

As a low-loss and high-temperature-operable semiconductor device, a device using silicon carbide (SiC) attracts attention, for example. The silicon carbide (SiC) has excellent physical properties than silicon (Si) in that bandgap is three times, breakdown field strength is approximately ten times, and thermal conductivity is approximately three times.

In a MOSFET (Metal Oxide Semiconductor Field Effect Transistor) using SiC or the like, a threshold value may vary by a temperature. Especially, in a MOSFET using SiC, a threshold value is easily lowered along with a temperature increase. In a semiconductor device, it is important to obtain a stable threshold value.

DETAILED DESCRIPTION

Figure 1A:
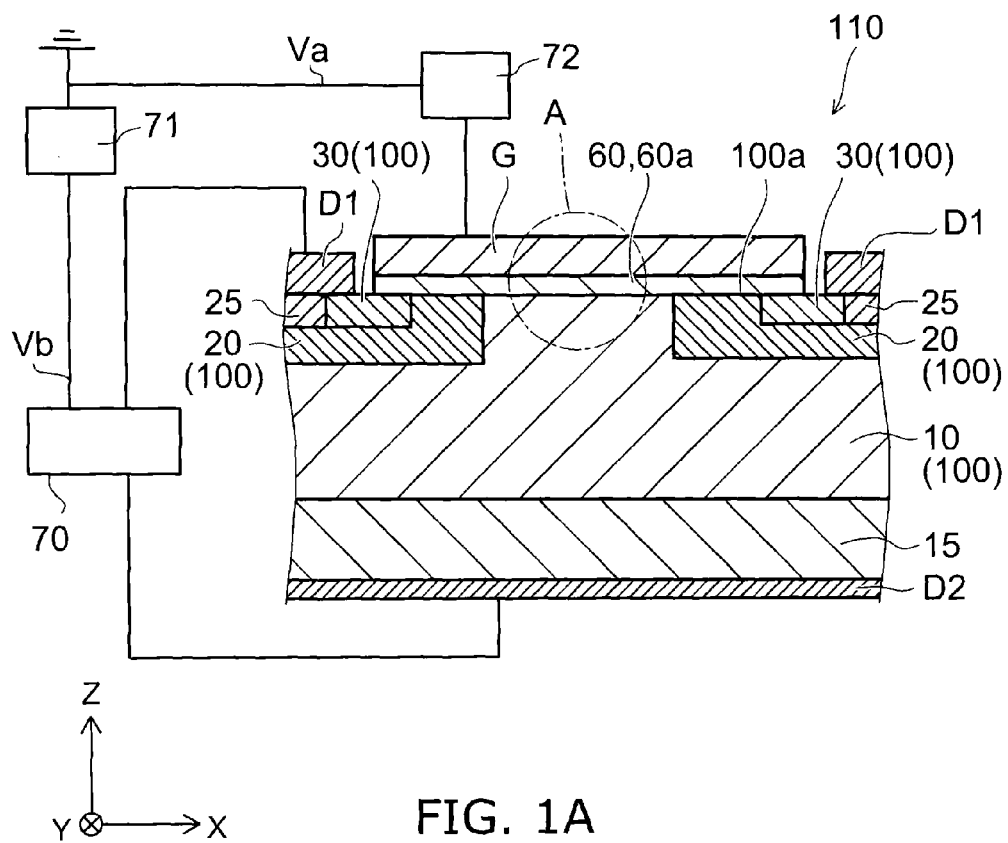
FIG. 1A and FIG. 1B are schematic views illustrating the configuration of a semiconductor device according to a first embodiment.

According to one embodiment, a semiconductor device includes a structure, an insulating film, a control electrode, a first electrode and a second electrode. The structure has a first surface, and includes a first semiconductor region of a first conductivity type, a second semiconductor region of a second conductivity type, and a third semiconductor region of the first conductivity type. The structure has a portion including the first semiconductor region, the second semiconductor region arranged in contact with the first semiconductor region, and the third semiconductor region arranged in contact with the second semiconductor region in a first direction along the first surface. The insulating film is provided on the first surface of the structure. The control electrode is provided on the insulating film. The first electrode is electrically connected to the third semiconductor region. The second electrode is electrically connected to the first semiconductor region. The insulating film includes a charge trap region trapping charges. A bias voltage is applied to the first electrode and the second electrode, and includes a shift voltage. The shift voltage makes a reference potential of a voltage applied to the first electrode and the second electrode shift from a reference potential of a voltage applied to the control electrode by a certain voltage.

Various embodiments will be described hereinafter with reference to the accompanying drawings.

It is to be noted that, in the following description, identical components in the drawings are shown with the same reference numerals, and description of the duplicate components is omitted as needed.

Also, in the following description, notations $n^+$, n, and $n^-$ and $p^+$, p, and $p^-$ represent relative degrees of impurity concentration in respective conductivity types. That is, $n^+$ represents that it is relatively higher in n-type impurity concentration than n while $n^-$ represents that it is relatively lower in n-type impurity concentration than n. Also, $p^+$ represents that it is relatively higher in p-type impurity concentration than p while $p^-$ represents that it is relatively lower in p-type impurity concentration than p.

In the embodiments, an example in which a first conductivity type is n-type while a second conductivity type is p-type will be raised as an example.

First Embodiment

Figure 1B:
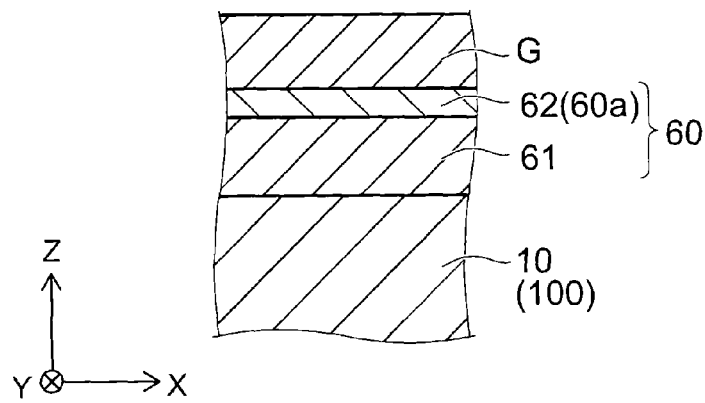

FIG. 1A and FIG. 1B are schematic views illustrating the configuration of a semiconductor device according to a first embodiment.

FIG. 1A shows a schematic cross-sectional view of a semiconductor device 110, and FIG. 1B shows a schematic cross-sectional view in which a section A shown in FIG. 1A is enlarged.

As shown in FIG. 1A, the semiconductor device 110 according to the embodiment is a DiMOSFET (Double Implanted Metal Oxide Semiconductor Field Effect Transistor) using SiC, for example.

The semiconductor device 110 includes a structure 100, an insulating film 60, a control electrode G, a first electrode D1, and a second electrode D2. The structure 100 has a first surface 100a. The structure 100 includes a first semiconductor region 10, a second semiconductor region 20, and a third semiconductor region 30.

In the embodiment, one direction along the first surface 100a (first direction) is referred to as an X-direction, a direction along the first surface 100a and perpendicular to the X-direction (third direction) is referred to as a Y-direction, and a direction perpendicular to the X-direction and the Y-direction (second direction) is referred to as a Z-direction.

The structure 100 has a portion in which the first semiconductor region 10, the second semiconductor region 20, and the third semiconductor region 30 are arranged in this order in the X-direction. The structure 100 has a portion in which the first semiconductor region 10, the second semiconductor region 20, and the third semiconductor region 30 are arranged in this order in the Z-direction.

The first semiconductor region 10, the second semiconductor region 20, and the third semiconductor region 30 are stacked in this order in the Z-direction. A part of the first semiconductor region 10 is exposed to the first surface 100a. A part of the second semiconductor region 20 is exposed to the first surface 100a. A part of the third semiconductor region 30 is exposed to the first surface 100a. On a side of the first surface 100a of the structure 100, the part of the first semiconductor region 10, the part of the second semiconductor region 20, and the part of the third semiconductor region 30 are arranged in the X-direction. The part of the second semiconductor region 20 is provided between the part of the first semiconductor region 10 and the part of the third semiconductor region 30.

In manufacturing the structure 100, the second semiconductor region 20 is formed in a part of the first semiconductor region 10 on a surface side, and the third semiconductor region 30 is formed in a part of the second semiconductor region 20 on a surface side.

A plurality of second semiconductor regions 20 may be provided. In a case where the plurality of second semiconductor regions 20 are provided, the plurality of second semiconductor regions 20 are disposed to be separated from one another in the X-direction and the Y-direction. For each of the second semiconductor regions 20, various shapes such as a line shape extending in the Y-direction, an island shape as seen in the Z-direction, and a ring shape as seen in the Z-direction are adopted.

A plurality of third semiconductor regions 30 may be provided. In a case where the plurality of third semiconductor regions 30 are provided, the plurality of third semiconductor regions 30 are disposed to be separated from one another in the X-direction. Each of the third semiconductor regions 30 is formed in a line shape, an island shape, a ring shape, or the like in accordance with a shape of the second semiconductor region 20, for example.

On the side of the first surface 100a, the part of the second semiconductor region 20 provided between the part of the first semiconductor region 10 and the part of the third semiconductor region 30 is a portion functioning as a channel of the DiMOSFET.

The insulating film 60 is provided on the first surface 100a of the structure 100. The insulating film 60 functions as a gate insulating film for the DiMOSFET. The insulating film 60 is provided along the first surface 100a. The insulating film 60 is provided on the first semiconductor region 10, the second semiconductor region 20, and the third semiconductor region 30.

The control electrode G is provided on the insulating film 60. The control electrode G functions as a gate electrode for the DiMOSFET. The first electrode D1 is electrically connected to the third semiconductor region 30. The second electrode D2 is electrically connected to the first semiconductor region 10.

In the semiconductor device 110 like this, the insulating film 60 includes a charge trap region 60a adapted to trap charges. As shown in FIG. 1B, the insulating film 60 has a first portion 61 and a second portion 62. The first portion 61 is provided on a side of the insulating film 60 closer to the first semiconductor region 10. The second portion 62 is provided on a side of the insulating film 60 closer to the control electrode G.

The second portion 62 includes the charge trap region 60a. Charges go in and out of the charge trap region 60a at high speed by voltage applied to the control electrode G. The second portion 62 desirably contacts the control electrode G. This facilitates high-speed movement of the charges between the control electrode G and the charge trap region 60a. To make the charges move at higher speed, a work function of a material for the control electrode G is desirably substantially equal to a mid gap of Si. By trapping of the charges by the charge trap region 60a, a threshold value of the semiconductor device 110 is stabilized.

Here, the mid gap of Si has an energy between 4.05 eV (bottom of conduction band) and 5.17 eV (top of valance band).

In the above "Substantially equal to the mid gap of Si" means that the work function of the material of the control electrode G is well accorded with the energy of dangling-bond of Si in the charge trap region 60a. The energy of dangling-bond of Si is within the range of the mid gap of Si. More properly, this means that the work function of the material of the control electrode G is well accorded with the energy of the trap level in the charge trap region 60a.

The charge transfer between the control electrode G and the charge trap region 60a becomes faster by the work function of the material of the control electrode G being well accorded with the energy of the trap level in the charge trap region 60a.

Further, in a case where the charge trap region 60a is made of SiN film or SiON film that trap level is the energy of dangling-bond of Si, the charge transfer between the control electrode G and the charge trap region 60a becomes faster by the work function of the material of the control electrode G being well accorded with the energy of dangling-bond of Si.

In the semiconductor device 110, control voltage is applied to the control electrode G from a voltage supplying unit 72. Also, bias voltage is applied to the first electrode D1 and the second electrode D2 from a voltage supplying unit 70. The bias voltage includes shift voltage $V_{shift}$. The shift voltage $V_{shift}$ is adjusted by a reference potential adjusting unit 71. When the charges are trapped by the charge trap region 60a, the threshold value of the semiconductor device 110 gets close to the shift voltage $V_{shift}$ and is stabilized.

Figure 2A:
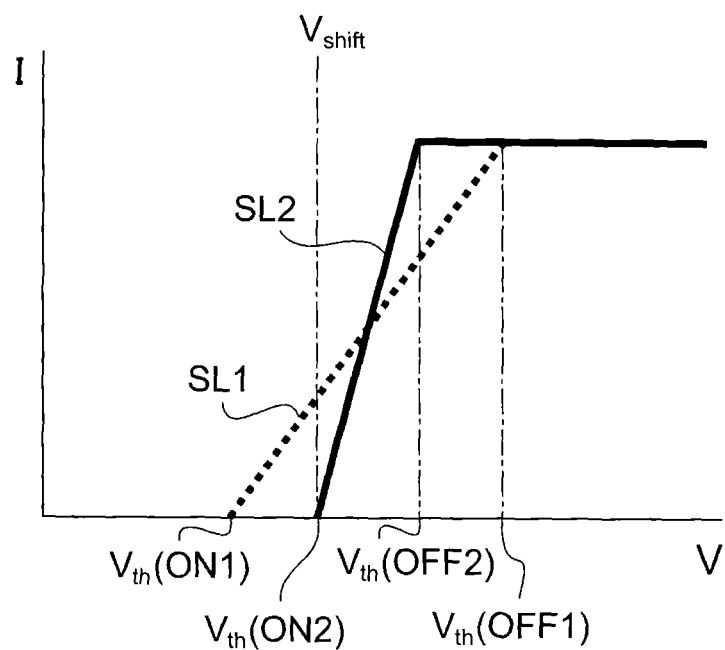
FIG. 2A and FIG. 2B illustrate changes in the threshold value.
Figure 2B:
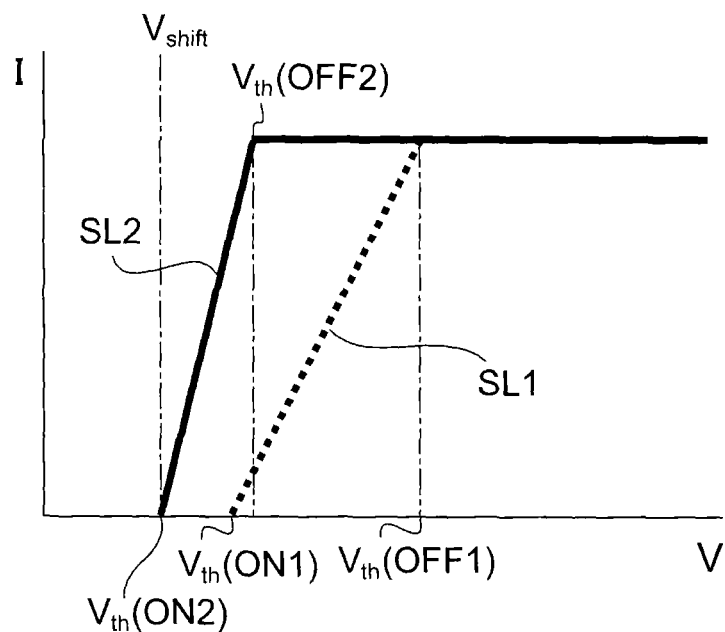

FIG. 2A and FIG. 2B illustrate changes in the threshold value.

FIG. 2A shows changes in the threshold value in a case where a first ON threshold value $V_{th}$ (ON1) is smaller than the shift voltage $V_{shift}$, and FIG. 2B shows changes in the threshold value in a case where the first ON threshold value $V_{th}$ (ON1) is larger than the shift voltage $V_{shift}$.

In FIG. 2A and FIG. 2B, a horizontal axis represents voltage V applied to the control electrode G while a vertical axis represents current I flowing from the second electrode D2 to the first electrode D1.

Here, voltage (ON threshold value) at which the current I begins to increase when the semiconductor device 110 as the DiMOSFET is turned from an OFF state to an ON state is referred to as $V_{th}$ (ON) while voltage (OFF threshold value) at which the current I begins to decrease when the semiconductor device 110 is turned from an ON state to an OFF state is referred to as $V_{th}$ (OFF). In a case where reference potential of the control electrode G is Va while reference potential of the first electrode D1 and the second electrode D2 is Vb, the shift voltage $V_{shift}$ is external voltage that makes the reference potential Vb shift from the reference potential Va.

The first ON threshold value $V_{th}$ (ON1) is an ON threshold value in a case where the insulating film 60 does not include the charge trap region 60a. A first OFF threshold value $V_{th}$ (OFF1) is an OFF threshold value in a case where the insulating film 60 does not include the charge trap region 60a.

A second ON threshold value $V_{th}$ (ON2) is an ON threshold value in a case where the insulating film 60 includes the charge trap region 60a. A second OFF threshold value $V_{th}$ (OFF2) is an OFF threshold value in a case where the insulating film 60 includes the charge trap region 60a.

First, as shown in FIG. 2A, changes in the threshold value in a case where the first ON threshold value $V_{th}$ (ON1) is smaller than the shift voltage $V_{shift}$ will be described.

In a case where the insulating film 60 includes the charge trap region 60a, negative charges are trapped by the charge trap region 60a in an OFF state. Since the negative charges are contained in the insulating film 60, the ON threshold value $V_{th}$ (ON) becomes the second ON threshold value $V_{th}$ (ON2), which is a value raised further to a side of the shift voltage $V_{shift}$ than the first ON threshold value $V_{th}$ (ON1). A difference between the second ON threshold value $V_{th}$ (ON2) and the shift voltage $V_{shift}$ is smaller than a difference between the first ON threshold value $V_{th}$ (ON1) and the shift voltage $V_{shift}$.

In an ON state, positive charges are trapped by the charge trap region 60a. Since the positive charges are contained in the insulating film 60, the OFF threshold value $V_{th}$ (OFF) becomes the second OFF threshold value $V_{th}$ (OFF2), which is a value lowered further to a side of the shift voltage $V_{shift}$ than the first OFF threshold value $V_{th}$ (OFF1). A difference between the second OFF threshold value $V_{th}$ (OFF2) and the shift voltage $V_{shift}$ is smaller than a difference between the first OFF threshold value $V_{th}$ (OFF1) and the shift voltage $V_{shift}$.

Next, as shown in FIG. 2B, changes in the threshold value in a case where the first ON threshold value $V_{th}$ (ON1) is larger than the shift voltage $V_{shift}$ will be described.

In a case where the insulating film 60 includes the charge trap region 60a, positive charges are trapped by the charge trap region 60a in an OFF state. Since the positive charges are contained in the insulating film 60, the ON threshold value $V_{th}$ (ON) becomes the second ON threshold value $V_{th}$ (ON2), which is a value lowered further to a side of the shift voltage $V_{shift}$ than the first ON threshold value $V_{th}$ (ON1). A difference between the second ON threshold value $V_{th}$ (ON2) and the shift voltage $V_{shift}$ is smaller than a difference between the first ON threshold value $V_{th}$ (ON1) and the shift voltage $V_{shift}$.

In an ON state, positive charges are trapped by the charge trap region 60a. Since the positive charges are contained in the insulating film 60, the OFF threshold value $V_{th}$ (OFF) becomes the second OFF threshold value $V_{th}$ (OFF2), which is a value lowered further to a side of the shift voltage $V_{shift}$ than the first OFF threshold value $V_{th}$ (OFF1). A difference between the second OFF threshold value $V_{th}$ (OFF2) and the shift voltage $V_{shift}$ is smaller than a difference between the first OFF threshold value $V_{th}$ (OFF1) and the shift voltage $V_{shift}$. In the ON state, more positive charges are trapped by the charge trap region 60a than in the OFF state. Thus, a difference between the first OFF threshold value $V_{th}$ (OFF1) and the second OFF threshold value $V_{th}$ (OFF2) is larger than a difference between the first ON threshold value $V_{th}$ (ON1) and the second ON threshold value $V_{th}$ (ON2).

When the charges are trapped by the charge trap region 60a in this manner, the threshold value of the semiconductor device 110 gets close to the shift voltage $V_{shift}$. When a sufficient number of charges are trapped by the charge trap region 60a, the threshold value of the semiconductor device 110 becomes approximately equal to the shift voltage $V_{shift}$. That is, the threshold value of the semiconductor device 110 gets close to the shift voltage $V_{shift}$ and is stabilized.

Here, the shift voltage $V_{shift}$ is set by potential supplied from the reference potential adjusting unit 71. Thus, the threshold value of the semiconductor device 110 is adjusted by the shift voltage $V_{shift}$ supplied from the reference potential adjusting unit 71. The threshold value of the semiconductor device 110 is arbitrarily set by the shift voltage $V_{shift}$ and is stabilized.

Next, a slope of the threshold value will be described.

A slope of the threshold value refers to a slope of a line line connecting between the ON threshold value $V_{th}$ (ON) and the OFF threshold value $V_{th}$ (OFF) in the current I to voltage V characteristics shown in FIG. 2A and FIG. 2B. A first threshold slope SL1 is a slope of a line connecting between the first ON threshold value $V_{th}$ (ON1) and the first OFF threshold value $V_{th}$ (OFF1). A second threshold slope SL2 is a slope of a line connecting between the second ON threshold value $V_{th}$ (ON2) and the second OFF threshold value $V_{th}$ (OFF2).

The semiconductor device 110 has the second threshold slope SL2. An angle of the second threshold slope SL2 is larger than an angle of the first threshold slope SL1. In the semiconductor device 110, the threshold slope erects further than that in a semiconductor device including no charge trap region 60a. Since the threshold slope erects, an ON/OFF switching characteristic (switching characteristic) is improved, and wasteful power consumption is restricted.

Figure 3:
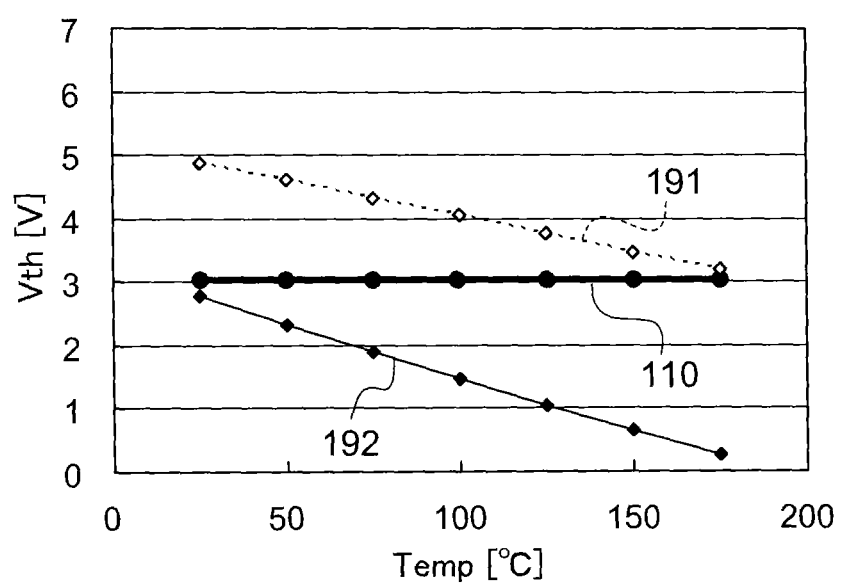
FIG. 3 illustrates changes in the threshold value by a temperature.

FIG. 3 illustrates changes in the threshold value by a temperature.

In FIG. 3, a horizontal axis represents a temperature while a vertical axis represents a threshold value. FIG. 3 shows changes in threshold values of the semiconductor device 110 according to the embodiment, a semiconductor device 191 according to Reference Example 1, and a semiconductor device 192 according to Reference Example 2.

The semiconductor device 191 is a DiMOSFET provided on a substrate in which an Si surface of 4H-SiC is nitrogen-terminated. The semiconductor device 192 is a DiMOSFET provided on a substrate in which a C surface of 4H-SiC is nitrogen-terminated. Neither the semiconductor device 191 nor the semiconductor device 192 includes the charge trap region 60a. In the semiconductor device 191 and the semiconductor device 192, lowering of the threshold value occurs along with a temperature increase. It is thought that the lowering of the threshold value is caused by the fact that negative charges are emitted from the gate insulating film easily as the temperature increases.

In the semiconductor device 110 according to the embodiment, the charges are trapped by the charge trap region 60a, and thus the threshold value is stabilized into the shift voltage $V_{shift}$ introduced from an outside. That is, in the semiconductor device 110, since a large number of charge traps are introduced, stabilization into a desired threshold value is achieved without dependence on a temperature. Accordingly, in the semiconductor device 110, variation of the threshold value along with changes in a temperature is slight. The threshold value of the semiconductor device 110 is stable even at a high temperature.

In the semiconductor device 110 according to the embodiment, the shift voltage $V_{shift}$, which makes the reference potential Vb of the first electrode D1 and the second electrode D2 shift from the reference potential Va of the control electrode G, is applied from a part of the device circuit.

In this case, threshold voltage is settled to this shift voltage $V_{shift}$. That is, the threshold voltage can be controlled into a desired value (shift voltage $V_{shift}$) from an outside. Also, even after completion of the device, by changing the shift voltage $V_{shift}$, a problem in which the threshold value shifts to cause reliability to be impaired (a problem of threshold value shift) is suppressed.

Further, the shift voltage $V_{shift}$ may be changed depending on a place for use, time, or timing, or may be controlled temporally depending on an occasion. In this case, the shift voltage $V_{shift}$ has only to be changed into a desired value.

Also, controlling the threshold voltage into a smaller value is advantageous in terms of simplification of a control circuit, cost reduction, ensuring of safety, and the like. In this respect, by setting the shift voltage $V_{shift}$ to a small value such as 1 volt (V), lowering of the threshold value is achieved. For example, variation in the threshold value easily occurs in a high-temperature operation, and lowering of the threshold value to approximately 2 V is a lower limit in a conventional configuration. With a configuration according to the embodiment, lowering of the threshold value to approximately 1 V is achieved.

Also, in the conventional configuration, the threshold voltage is designed to be approximately 5 V to 7 V and is designed to be approximately 3 V in a high-temperature operation from a viewpoint of stability of the device. However, since leak increases when the threshold voltage is high, the threshold voltage is desirably kept as low as approximately 5 V. Based on the above, it is appropriate to set the shift voltage $V_{shift}$ given from an outside to 1 V or higher and 5V or lower.

In the configuration according to the embodiment, a case in which only the charge traps are introduced and in which the shift voltage $V_{shift}$ is not introduced will be considered. That is, a case in which the charge traps are introduced in a case where the reference potential Va and the reference potential Vb correspond (normal configuration) will be considered. In this case, the threshold voltage infinitely gets closer to zero, and the threshold voltage $V_{th}$ becomes zero without dependence on a temperature. Accordingly, no charge traps are introduced in the normal configuration.

Also, a case in which only the shift voltage $V_{shift}$ is introduced and in which no charge traps are introduced will be considered. That is, a case in which only the shift voltage $V_{shift}$ is introduced in a normal configuration in which no charge traps are introduced will be considered. In this case, the threshold voltage $V_{th}$ moves in parallel as much as the shift voltage $V_{shift}$ from the threshold voltage $V_{th}$ of each of the semiconductor devices 191 and 192 shown in FIG. 3. In such a configuration, stabilization of the threshold value against the temperature is not achieved.

In this manner, just introducing either the charge traps or the shift voltage $V_{shift}$ cannot bring about a desired stable threshold value. The inventors of the invention have discovered that the threshold voltage can be stabilized as that of the semiconductor device 110 shown in FIG. 3 by introducing both the charge traps and the shift voltage $V_{shift}$.

Next, an example of the semiconductor device 110 will be described.

The first semiconductor region 10 is provided on a substrate 15 including high-concentration n-type ($n^+$-type) silicon carbide (4H—SiC: silicon carbide). The first semiconductor region 10 is a low-concentration n-type ($n^-$-type) 4H-SiC layer, for example.

In the embodiment, a structure in which the first semiconductor region 10 is formed on the substrate 15 is used as a substrate for forming a device. Impurity concentration of the first semiconductor region 10 ($n^-$-type SiC layer) is lower than impurity concentration of the substrate 15 ($n^+$-type SiC substrate). The first semiconductor region 10 is a breakdown voltage holding layer for the semiconductor device 110.

SiC can exist in many polytypes. In the embodiment, a 4H structure is used as a polytype of SiC. In the semiconductor device 110 using 4H-structured SiC, high breakdown voltage can be obtained. Also, since mobility in a bulk is high, the 4H structure is suitable for fabrication of a power device.

On a rear surface of the substrate 15, the second electrode D2 including a conductive material is formed. The second electrode D2 is a drain electrode for the DiMOSFET, for example. The second electrode D2 has a stacked structure by depositing Ni and Ti, for example. The second electrode D2 is in ohmic contact with the rear surface of the substrate 15 by annealing at 1000° C., for example.

In parts on a surface of the first semiconductor region 10, the plurality of second semiconductor regions 20 each having a predetermined film thickness are provided to be separated from one another. Each of the second semiconductor regions 20 is a low-concentration p-type ($p^-$-type) SiC region. Each of the second semiconductor regions 20 is formed to have a depth from the first surface 100a of the structure 100 to an internal halfway portion. The first semiconductor region 10 is disposed between the two second semiconductor regions 20. Each of the second semiconductor regions 20 may be formed in a ring shape, a honeycomb shape, or the like as seen in the Z-direction.

At a part on a surface of the second semiconductor region 20, the third semiconductor region 30 having a predetermined film thickness to have a depth from the first surface 100a of the structure 100 to an internal halfway portion is provided. The third semiconductor region 30 is a high-concentration n-type ($n^+$-type) SiC region.

A contact region 25 is provided at a part on the surface of the second semiconductor region 20. The contact region 25 is disposed side-by-side with the third semiconductor region 30. The contact region 25 is a p-type ($p^+$-type) SiC region.

In this manner, the second semiconductor region 20 is provided between the first semiconductor region 10 and the third semiconductor region 30. The second semiconductor region 20 contacts the first semiconductor region 10 and the third semiconductor region 30, respectively. In the second semiconductor region 20 sandwiched between the first semiconductor region 10 and the third semiconductor region 30, a channel is formed.

The insulating film 60 is provided on the first surface 100a of the structure 100. The insulating film 60 is provided on the first semiconductor region 10, the second semiconductor region 20, and the third semiconductor region 30 continuously. For the insulating film 60, $SiO_2$ is used, for example.

The control electrode G is formed on the insulating film 60. The control electrode G is provided via the insulating film 60 on parts of the first semiconductor region 10, the second semiconductor region 20, and the third semiconductor region 30.

The first electrode D1 is provided on the third semiconductor region 30 and the contact region 25. The first electrode D1 is a source electrode for the DiMOSFET, for example. The first electrode D1 has a stacked structure by Al and Ni, for example. The first electrode D1 is formed at a temperature of approximately 800° C., for example, and is in ohmic contact with the contact region 25. The third semiconductor region 30 is a source region for the DiMOSFET.

In the semiconductor device 110, a plurality of configurations shown in FIG. 1 are disposed in parallel. In the semiconductor device 110, current flows in the entirety of the configurations disposed in parallel, and switching is performed by voltage application to the control electrode G.

Here, the insulating film 60 includes the charge trap region 60a. For the charge trap region 60a, an SiN film is used, for example. The first portion 61 of the insulating film 60 is an SiO$_2$ film, for example, and the second portion 62 is an SiN film, for example. The second portion 62 functions as the charge trap region 60a.

To make the SiN film function as the charge trap region 60a, the SiN film needs to be Si-rich. In a case where the SiN film is Si-rich, a plurality of Si dangling bonds exists, and electrons and holes are easy to be trapped.

When a composition ratio of SiN (an element in a composition ratio of elements is hereinafter expressed as [chemical symbol]) is [Si]/[N]=3/4=0.75, dangling bonds disappear, and charge trapping ceases. From this state, as SiN is made to be Si-rich, a charge trapping amount increases. Accordingly, the composition ratio of SiN needs to satisfy [Si]/[N]>0.75.

To increase the charge trapping amount, SiN favorably has more Si. In a case where [Si]/[N] is 0.85 or higher, a sufficient number of charges are trapped. On the other hand, when [Si]/[N] exceeds 1.05, the entire film becomes a metal, and potential adjustment by charge trapping cannot be performed. In other words, when an Si amount is excessive, the film gradually becomes metallic by interactions of adjacent dangling bonds. An upper limit of the Si amount without metallic charge transfer is [Si]/[N]=0.95. Based on the above, the composition ratio of SiN is 0.75<[Si]/[N] <1.05, and preferably 0.85<[Si]/[N]<0.95. In the embodiment, 0.9, which is a middle amount in the above range, is applied.

To make the SiN film function as the charge trap region 60a, surface density of the charge traps is important. The charges go in and out at higher speed when the SiN film is thinner. Accordingly, a thickness of the SiN film is favorably 8 nanometers (nm) or less. In addition, for high-speed movement, the thickness of the SiN film is favorably 4 nm or less.

On the other hand, to trap charges sufficiently, a certain thickness is required. Accordingly, the thickness of the SiN film needs to be 0.5 nm or more. Further, to keep film uniformity, the thickness of the SiN film is favorably 1 nm or more. Based on the above, the thickness of the SiN film is 0.5 nm or more and 8 nm or less, and more preferably 1 nm or more and 4 nm or less. An optimal thickness is approximately 2.5 nm. In the embodiment, 2.5 nm is applied as the thickness of the SiN film.

Second Embodiment

Next, a method for manufacturing the semiconductor device according to the embodiment will be described.

Figure 4:
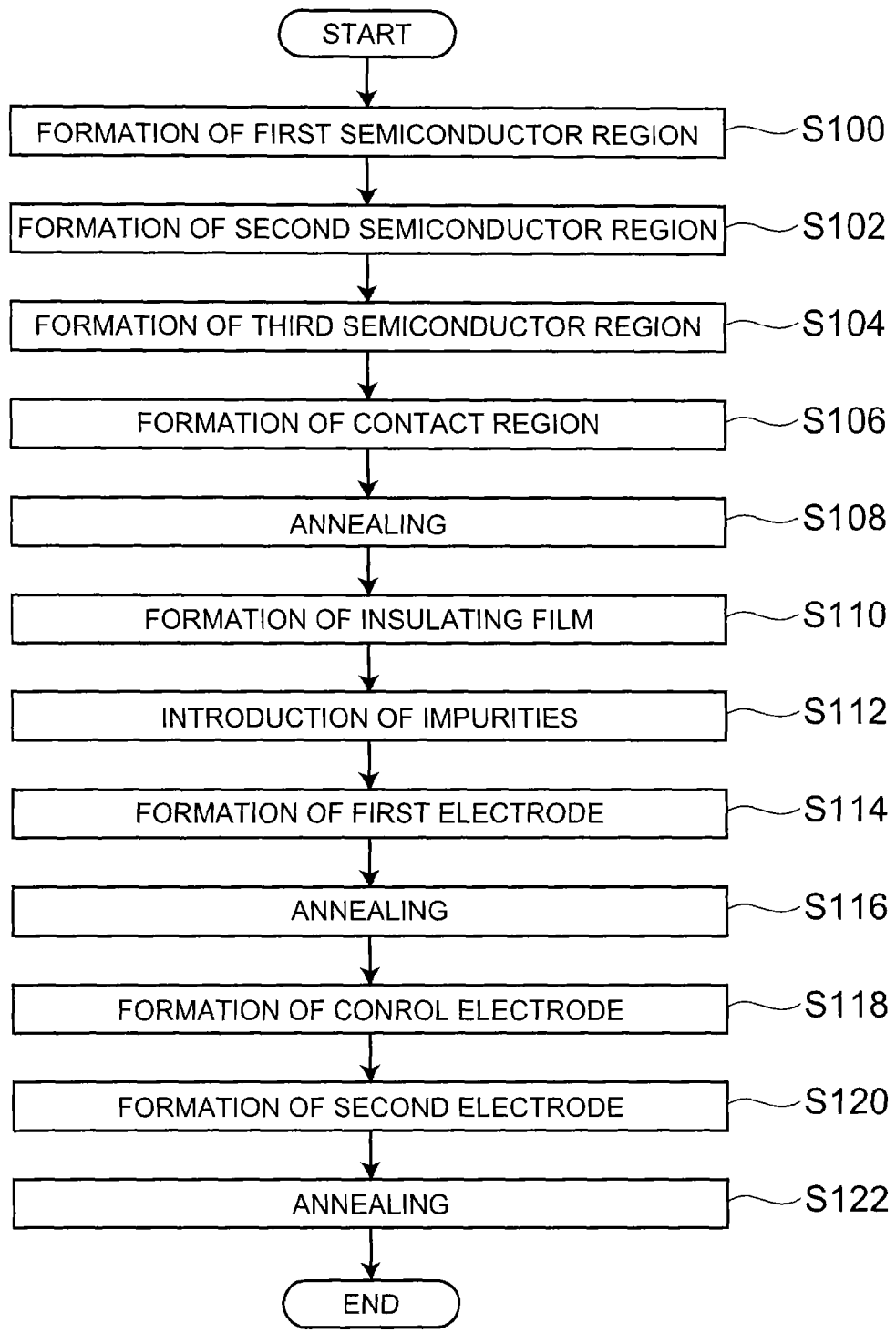
FIG. 4 is a flowchart illustrating a method for manufacturing the semiconductor device according to the embodiment.

FIG. 4 is a flowchart illustrating a method for manufacturing the semiconductor device according to the embodiment.

FIG. 5A to FIG. 6D are schematic cross-sectional views illustrating the method for manufacturing the semiconductor device.

Hereinafter, an example of the method for manufacturing the semiconductor device will be described with reference to FIG. 4 and FIG. 5A to FIG. 6D.

Figure 5A:
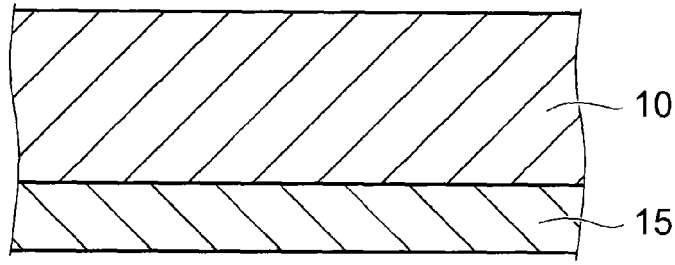
FIG. 5A to FIG. 6D are schematic cross-sectional views illustrating the method for manufacturing the semiconductor device.

First, as shown in step S100 in FIG. 4, the first semiconductor region 10 is formed. That is, as shown in FIG. 5A, the first semiconductor region 10 including an n$^-$-type 4H-SiC layer is formed on a surface of the n$^+$-type 4H—SiC substrate 15. As the substrate 15, a solid single crystal SiC substrate is used, for example.

Impurity concentration (doping concentration) in the substrate 15 is favorably 1×10$^{16}$ atoms/cm$^3$ or more and less than 1×10$^{20}$ atoms/cm$^3$. In the embodiment, impurity concentration of the substrate 15 is 6×10$^{17}$ atoms/cm$^3$, for example.

As the substrate 15, a (0001) plane hexagonal SiC substrate (4H-SiC substrate) is favorable. Although the (0001) plane is used in the embodiment, another plane direction such as (000-1) plane is available as well.

The first semiconductor region 10 is formed by epitaxially growing the n$^-$-type 4H-SiC layer on a surface of the substrate 15. When the epitaxial layer is formed, SiH$_4$ gas and C$_3$H$_8$ gas are used as source gas, for example. Also, N or P is favorably used as impurities (dopant). The first semiconductor region 10 is a breakdown voltage holding layer.

A film thickness of the first semiconductor region 10 is favorably 5 μm or more and 100 μm or less, for example, and is desirably larger for a higher breakdown voltage device. In the embodiment, the film thickness of the first semiconductor region 10 is 10 μm, for example. Also, impurity concentration (doping concentration) of the first semiconductor region 10 is favorably 8×10$^{14}$ atoms/cm$^3$ or more and less than 3×10$^{17}$ atoms/cm$^3$. In the embodiment, impurity concentration of the first semiconductor region 10 is 5×10$^{15}$ atoms/cm$^3$, for example.

Figure 5B:
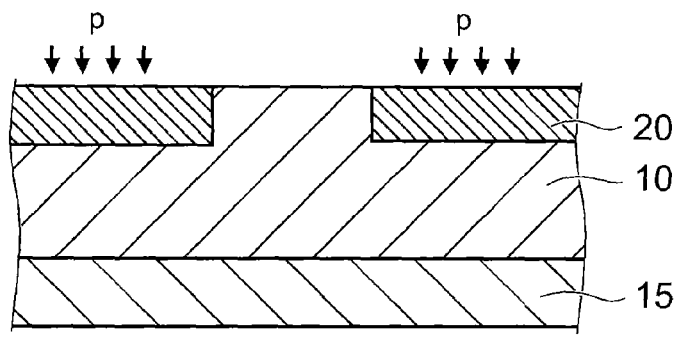

Subsequently, as shown in step S102 in FIG. 4, the second semiconductor region 20 is formed. The second semiconductor region 20 is formed by ion implantation of p-type impurities. That is, as shown in FIG. 5B, with use of an oxide film (not shown) formed by photolithography and etching as a mask, impurities whose conductivity type is p-type are selectively implanted in a surface region of the SiC layer as the first semiconductor region 10. Thus, the second semiconductor region 20 including a p$^-$-type 4H-SiC region is formed.

Conductive impurity concentration of the second semiconductor region 20 is 1×10$^{16}$ atoms/cm$^3$, for example. As conditions for implantation of Al ions that are p-type impurities, a dose amount is 1×10$^{15}$ atoms/cm$^3$, and energy is 80 keV, for example. In the embodiment, the substrate 15 is heated to 300° C. for the above ion implantation, for example.

Figure 5C:
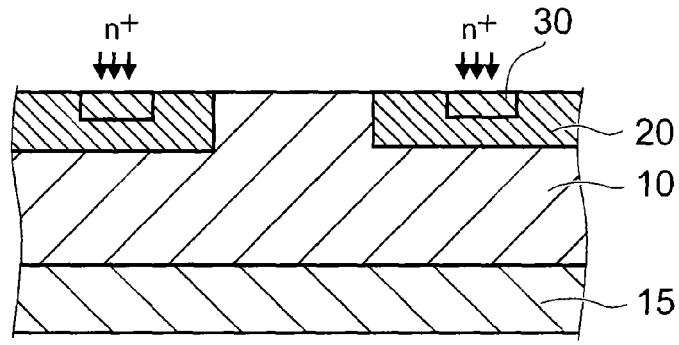

Subsequently, as shown in step S104 in FIG. 4, the third semiconductor region 30 is formed. The third semiconductor region 30 is formed by ion implantation of n-type impurities. That is, as shown in FIG. 5C, n-type conductive impurities are selectively implanted at a part of a surface of the second semiconductor region 20. Thus, the third semiconductor region 30 including an n$^+$-type 4H-SiC region is formed.

Specifically, after the oxide film mask used for formation of the second semiconductor region 20 is removed, an oxide film mask (not shown) having a new pattern is formed again by photolithography and etching. Subsequently, n-type conductive impurities are implanted through an opening of the new mask. Thus, the third semiconductor region 30 is formed.

Conductive impurity concentration of the third semiconductor region 30 is 2×10$^{20}$ atoms/cm$^3$, for example. As conditions for implantation of N ions that are n-type impurities, a dose amount is 1×10$^{15}$ atoms/cm$^3$, and energy is 40 keV, for example. In the embodiment, the substrate 15 is heated to 300° C. for the above ion implantation. Conductive impurity concentration of the third semiconductor region 30 is favorably 1×10$^{14}$ atoms/cm$^3$ or more and 5×10$^{20}$ atoms/cm$^3$ or less. The conductive impurity concentration is more preferably 5×10$^{15}$ atoms/cm$^3$ or more and 3×10$^{20}$ atoms/cm$^3$ or less.

Figure 5D:
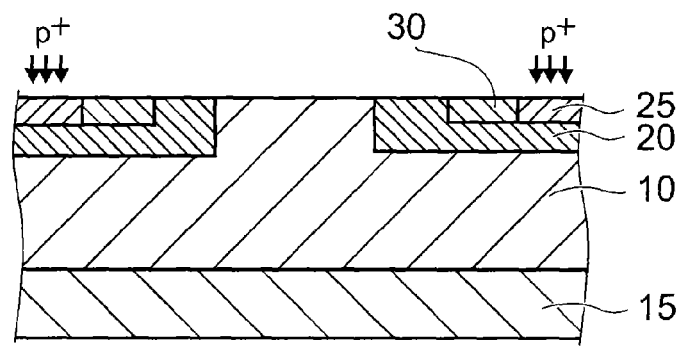

Subsequently, as shown in step S106 in FIG. 4, the contact region 25 is formed. The contact region 25 is formed by ion implantation of p-type impurities. That is, as shown in FIG. 5D, p-type conductive impurities are selectively implanted in another part on the surface of the second semiconductor region 20 so as to be contiguous to the third semiconductor region 30. Thus, the contact region 25 including a $p^+$-type 4H-SiC region is formed.

Specifically, after the oxide film mask used for formation of the third semiconductor region 30 is removed, an oxide film mask (not shown) having a new pattern is formed again by photolithography and etching. Subsequently, p-type conductive impurities are implanted through an opening of the new mask. Thus, the contact region 25 is formed.

Conductive impurity concentration of the contact region 25 is $2\times10^{20}$ atoms/cm$^3$, for example. As conditions for implantation of Al ions that are p-type impurities, a dose amount is $1\times10^{15}$ atoms/cm$^3$, and energy is 40 keV, for example. In the embodiment, the substrate 15 is heated to 300° C. for the above ion implantation. Conductive impurity concentration of the contact region 25 is favorably $1\times10^{14}$ atoms/cm$^3$ or more and $5\times10^{20}$ atoms/cm$^3$ or less. The conductive impurity concentration is more preferably $5\times10^{15}$ atoms/cm$^3$ or more and $3\times10^{20}$ atoms/cm$^3$ or less.

Subsequently, as shown in step S108 in FIG. 4, annealing is performed. That is, after the above ion implantation processes, an activation annealing treatment is performed. For this activation annealing treatment, conditions in which a heating temperature is 1600° C. and in which heating time is 30 minutes are used with use of argon (Ar) gas as atmosphere gas, for example. In this manner, a structure shown in FIG. 5D is obtained. At this time, the dopant introduced in the SiC substrate is activated but is rarely diffused.

It is to be noted that, in formation of the second semiconductor region 20, the third semiconductor region 30, and the contact region 25, carbon ions may be codoped. At this time, by the high-temperature annealing shown in step S108, excessive carbon ions are diffused to the first semiconductor region 10, the substrate 15, and an outside and do not remain in the second semiconductor region 20. As a result, characteristic changes on the MOS interface by presence/absence of codoping of carbon ions at this stage are in an unobservable level.

Figure 6A:
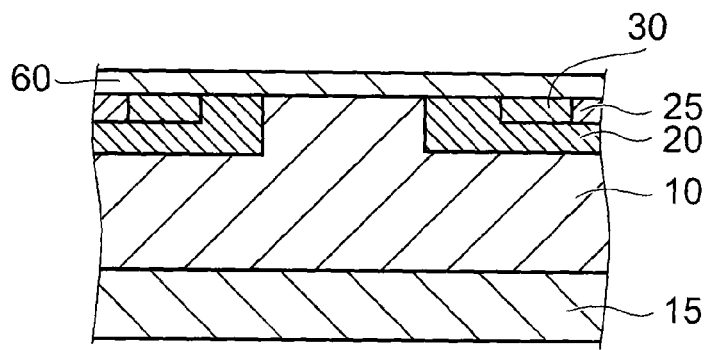

Subsequently, as shown in step S110 in FIG. 4, the insulating film 60 is formed. That is, as shown in FIG. 6A, the insulating film 60 is formed to cover the entirety of surfaces of the first semiconductor region 10, the second semiconductor region 20, and the third semiconductor region 30. For the insulating film 60, SiO$_2$ is used, for example. For the insulating film 60, SiN or a high permittivity material (high-k material) may be used. As a method for forming the insulating film 60, a thermal oxidation method, a wet oxidation method, or a deposition method such as CVD is used.

Figure 6B:
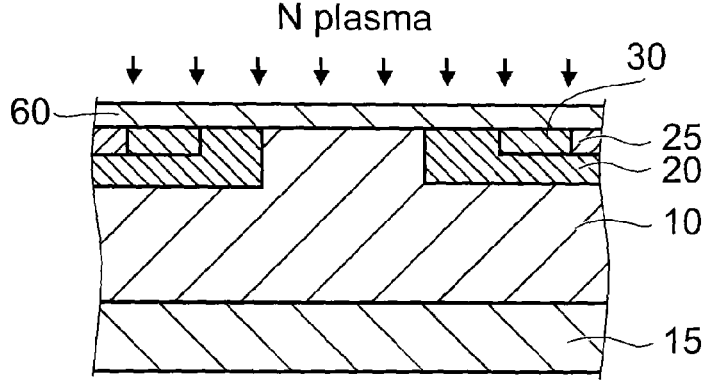
Figure 6C:
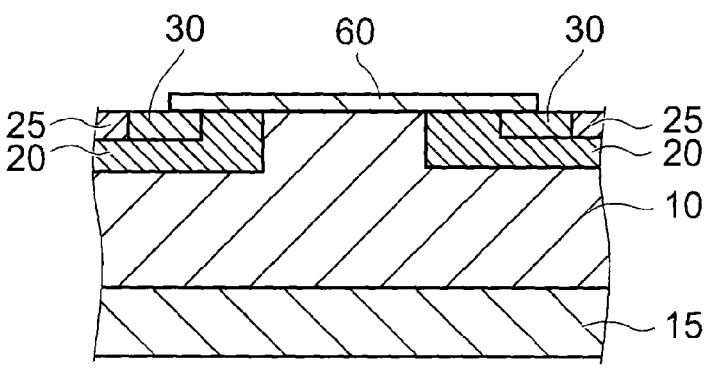

Subsequently, as shown in step S112 in FIG. 4, impurities are introduced. In the embodiment, N is used as impurities. As shown in FIG. 6B, plasma nitridation is performed via the insulating film 60. Thus, the charge trap region 60a made of an SiN film is formed in a surface portion of the insulating film 60.

Subsequently, as shown in step S114 in FIG. 4, the first electrode D1 is formed. The first electrode D1 is a source electrode, for example. To form the first electrode D1, a resist film (not shown) having a pattern is first formed on the insulating film 60 by a photolithographic method. Thereafter, with use of the resist film as a mask, a part of the insulating film 60 located on a surface of the contact region 25 and a part of a surface of the third semiconductor region 30 is removed by etching (see FIG. 6C).

Subsequently, on the surface of the contact region 25 and the part of the surface of the third semiconductor region 30 exposed by an opening formed by removing the resist film and the insulating film 60, a conductive film such as metal is formed. The conductive film becomes the first electrode D1.

Thereafter, by removing the resist film, the conductive film located on the resist film is lifted off. Also, by decreasing a width of the insulating film 60 by etchback or the like, a gap is formed so as to prevent contact between the insulating film 60 and the first electrode D1. Here, as a conductive material for the first electrode D1, nickel (Ni) is favorable, for example.

Subsequently, as shown in step S116 in FIG. 4, annealing is performed. That is, in the annealing process, after formation of the first electrode D1, a heat treatment at 800° C. is performed, for example. For example, the annealing process is performed in argon (Ar) gas with heating time of 5 minutes.

By the above heat treatment, the first electrode D1 including Ni$_2$Si is formed. Since a large amount of N is introduced in the third semiconductor region 30, an electrode structure with low contact resistance is obtained by this annealing process. Also, since a large amount of Al is introduced in the contact region 25, a contact with low contact resistance is obtained easily.

Figure 6D:
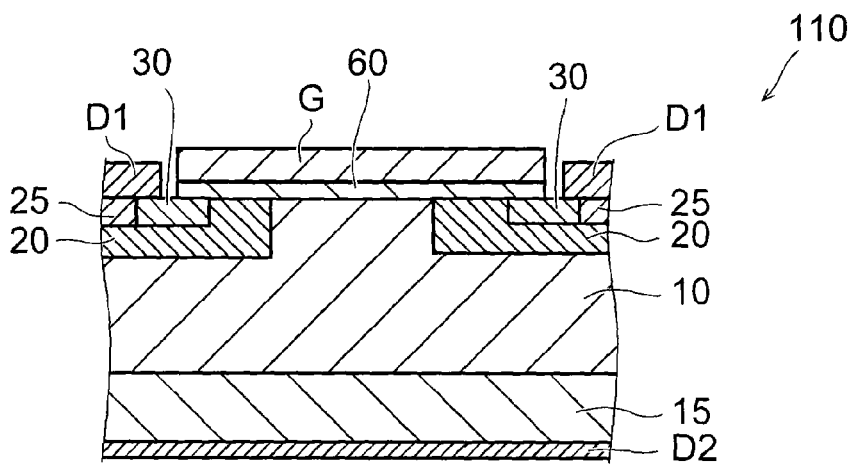

Subsequently, as shown in step S118 in FIG. 4, the control electrode G is formed. That is, as shown in FIG. 6D, the control electrode G is formed on the insulating film 60. For the control electrode G, n-type polysilicon is used, for example.

It is to be noted that, by using n-type polysilicon for the first electrode D1 as well, further forming Ni films to the first electrode D1 and the control electrode G, and performing a heat treatment, salicide films such as NiSi, Ni$_2$Si, and NiSi$_2$ may be formed as electrodes.

Subsequently, as shown in step S120 in FIG. 4, the second electrode D2 is formed. The second electrode D2 is a drain electrode, for example. As shown in FIG. 6D, the second electrode D2 is formed on a rear surface of the substrate 15. As the second electrode D2, a stacked structure of Ni and Ti is used, for example. The second electrode D2 is provided on an entire surface of the rear surface of the substrate 15, for example.

Subsequently, as shown in step S122 in FIG. 5, annealing is performed. In this annealing process, a heat treatment at approximately 800° C. is performed. As conditions for this annealing process, the annealing process is performed in argon (Ar) gas with heating time of 5 minutes, for example. By this heat treatment, Ni$_2$Si is formed on an interface between the second electrode D2 and the substrate 15, for example. Thus, the second electrode D2 is in ohmic contact with the substrate 15.

By the above processes, the semiconductor device 110 is completed.

Next, another example of the charge trap region 60a will be described.

The charge trap region 60a may include SiON instead of SiN. In this case, the second portion 62 of the insulating film 60 is an SiON film.

A composition ratio of O to a composition ratio of N in SiON included in the charge trap region 60a is less than 0.01. In this case, SiON can be regarded as SiN.

In the above case, a composition ratio of Si to a composition ratio of N in SiON included in the charge trap region 60a is 0.85 or more and 0.95 or less.

In a case where a composition ratio of O to a composition ratio of N in SiON included in the charge trap region 60a is 0.01 or more, a composition ratio of Si in SiON included in the charge trap region 60a satisfies $1.13<[Si]/(1/2\,[O]+3/4\,[N])<1.27$.

Thus, the SiON film is Si-rich, a plurality of Si dangling bonds exist, and electrons and holes are easy to be trapped.

To make the SiON film function as the charge trap region 60a, surface density of the charge traps is important. The charges go in and out at higher speed when the SiON film is thinner. Accordingly, a thickness of the SiON film is favorably 8 nanometers (nm) or less. In addition, for high-speed movement, the thickness of the SiON film is favorably 4 nm or less.

On the other hand, to trap charges sufficiently, a certain thickness is required. Accordingly, the thickness of the SiON film needs to be 0.5 nm or more. Further, to keep film uniformity, the thickness of the SiON film is favorably 1 nm or more. Based on the above, the thickness of the SiON film is 0.5 nm or more and 8 nm or less, and more preferably 1 nm or more and 4 nm or less. An optimal thickness is approximately 2.5 nm. In the embodiment, 2.5 nm is applied as the thickness of the SiON film.

The charge trap region 60a may include an oxide dielectric of Ti, Zr, or Hf to which at least one selected from the group consisting of Tc, Re, Ru, Os, Rh, Ir, Pd, Pt, Co, Ni, W, Mo, Cr, Mn, and Fe is added, instead of the SiN film.

Also, at least one selected from the group consisting of N, C, B, Mg, Ca, Sr, Ba, Al, Sc, Y, and La may be added to the above oxide dielectric.

Figure 7A:
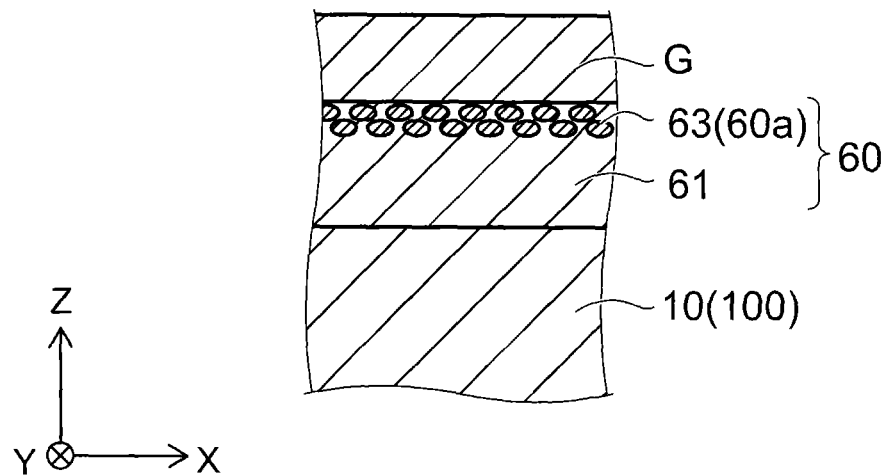
FIG. 7A and FIG. 7B are schematic cross-sectional views illustrating a clustered oxide dielectric.
Figure 7B:
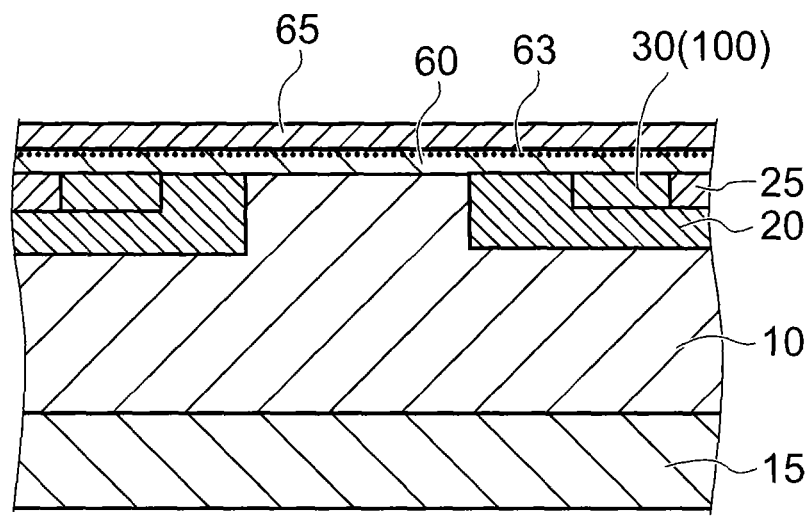

FIG. 7A and FIG. 7B are schematic cross-sectional views illustrating a clustered oxide dielectric.

FIG. 7A shows the insulating film 60 including a clustered oxide dielectric 63. FIG. 7B shows an example of a method for manufacturing the insulating film 60 including the clustered oxide dielectric 63.

As shown in FIG. 7A, the insulating film 60 may include the clustered oxide dielectric 63. The clustered oxide dielectric 63 acts as the charge trap region 60a. Examples of the clustered oxide dielectric 63 include $SrTiO_3$ to which Ru is added, HfSiON to which Ru is added, and $HfO_2$ to which Ru is added.

To form the clustered oxide dielectric 63 in the insulating film 60, as shown in FIG. 7B, after the insulating film 60 is formed, a film 65 including the oxide dielectric 63 is formed on the insulating film 60. An example of the film 65 is an $HfSiO_4$ film to which Ru is added. By performing annealing after formation of the film 65, the clustered oxide dielectric 63 is formed in the insulating film 60. In a case where the charge trap region 60a is the clustered oxide dielectric 63, charges move at higher speed.

Third Embodiment

Figure 8:
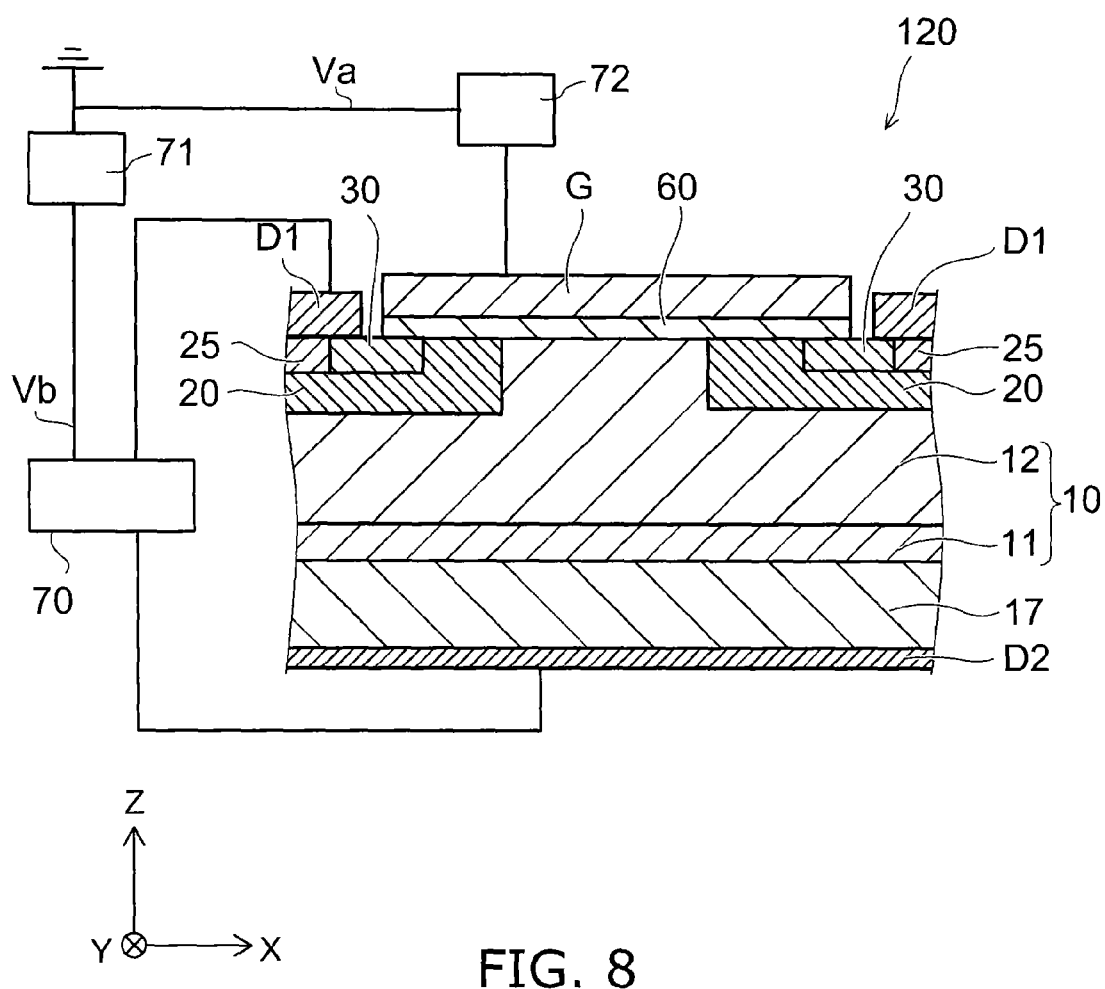
FIG. 8 is a schematic cross-sectional view illustrating a semiconductor device according to a third embodiment.

FIG. 8 is a schematic cross-sectional view illustrating a semiconductor device according to a third embodiment.

As shown in FIG. 8, a semiconductor device 120 according to the third embodiment is an example in which the embodiment has been applied especially to an IGBT (Insulated Gate Bipolar Transistor).

Different points of the semiconductor device 120 from the semiconductor device 110 include using a substrate 17 (fourth semiconductor region) made of $p^+$-type 4H-SiC instead of the substrate 15 made of $n^+$-type SiC, and the first semiconductor region 10 having a stacked structure of a first layer 11 including an $n^+$-type 4H-SiC layer and a second layer 12 including an $n^-$-type 4H-SiC layer. The first semiconductor region 10 contacts the substrate 17 and is provided on the substrate 17. The first layer 11 and the second layer 12 are breakdown voltage holding layers.

On a rear surface (lower surface) of the substrate 17, the second electrode D2 is formed. This second electrode D2 is a collector electrode. In the embodiment, a Ti and Al stacked film is used as the second electrode D2. The second electrode D2 obtains ohmic contact by an annealing process at 800° C. in Ar for 2 minutes, for example.

Also, the first electrode D1 on the contact region 25 is an emitter electrode in the embodiment. The first electrode D1 is in ohmic contact with the third semiconductor region 30 and the contact region 25.

A method for manufacturing the semiconductor device 120 is substantially the same as the method for manufacturing the semiconductor device 110 except for forming the first layer 11 and the second layer 12 on the substrate 17.

In the embodiment like this, the IGBT with a stable threshold value is achieved. In the semiconductor device 120, since a bipolar operation is performed, conductivity modulation occurs, and on-resistance is lowered. As a result, conducting ability is drastically heightened further than that of the MOSFET.

(Variations)

Although examples in which the embodiments have been applied to the DiMOSFET or the IGBT have been described in the embodiments, the embodiments can be applied to a device as long as the device has a structure in which a p-type 4H—SiC region (second semiconductor region 20) is provided at a surface part of an SiC region (first semiconductor region 10) and in which a gate electrode (control electrode G) is provided via a gate insulating film (insulating film 60) on the p-type 4H-SiC region.

For example, the embodiments can be applied to a transistor such as the DiMOSFET and the IGBT having a trench gate structure. The embodiments can also be applied to a device as long as the device has a semiconductor region, an insulating film provided on the semiconductor region, and an electrode provided on the insulating film, such as a JFET (Junction Field Effect Transistor) and a diode.

Also, although examples of using SiC have been described in the embodiments, other materials such as a compound semiconductor such as gallium nitride (GaN), Si, diamond, and carbon may be used. The embodiments are especially effective to a semiconductor device using SiC, GaN, diamond, and carbon that is suitable for an operation under an environment of as a high temperature as 80° C. or higher, for example.

As described above, with the semiconductor device according to the embodiments, a stable threshold value can be obtained.

The embodiments have been described above with reference to the specific examples. However, the embodiments are not limited to these specific examples. That is, a person skilled in the art appropriately adds design changes to these specific examples, and such changes are encompassed within the scope of the embodiments as long as they have features of the embodiments. Each component included in each of the aforementioned specific examples, and arrangement, a material, a condition, a shape, a size, and the like of the component are not limited to the illustrated ones but can be changed appropriately.

For example, although a first conductivity type is n-type while a second conductivity type is p-type in each of the aforementioned embodiments and each of the variations, the first conductivity type can be p-type while the second conductivity type can be n-type in carrying out the invention.

Each element included in embodiments described above can be combined to the extent possible and these combinations are also encompassed within the scope of the embodiments as long as they include the features of the embodiments. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a structure having a first surface, comprising a first semiconductor region of a first conductivity type, a second semiconductor region of a second conductivity type, and a third semiconductor region of the first conductivity type, and having a portion comprising the first semiconductor region, the second semiconductor region arranged in contact with the first semiconductor region, and the third semiconductor region arranged in contact with the second semiconductor region in a first direction along the first surface;
an insulating film provided on the first surface of the structure;
a control electrode provided on the insulating film;
a first electrode electrically connected to the third semiconductor region; and
a second electrode electrically connected to the first semiconductor region,
the insulating film comprising a charge trap region trapping charges; and
a bias voltage being applied to the first electrode and the second electrode, and the bias voltage comprising a shift voltage, the shift voltage making a reference potential of a voltage applied to the first electrode and the second electrode shift from a reference potential of a voltage applied to the control electrode by a certain voltage,
wherein the charge trap region comprises SiN, and
wherein a composition ratio of Si to a composition ratio of N in SiN present in the charge trap region is 0.85 or more and 0.95 or less.

2. The device according to claim 1, wherein the insulating film comprises $SiO_2$.

3. A semiconductor device comprising:
a structure having a first surface, comprising a first semiconductor region of a first conductivity type, a second semiconductor region of a second conductivity type, and a third semiconductor region of the first conductivity type, and having a portion comprising the first semiconductor region, the second semiconductor region arranged in contact with the first semiconductor region, and the third semiconductor region arranged in contact with the second semiconductor region in a first direction along the first surface;
an insulating film provided on the first surface of the structure;
a control electrode provided on the insulating film;
a first electrode electrically connected to the third semiconductor region; and
a second electrode electrically connected to the first semiconductor region,
the insulating film comprising a charge trap region trapping charges, and
a bias voltage being applied to the first electrode and the second electrode, and the bias voltage comprising a shift voltage, the shift voltage making a reference potential of a voltage applied to the first electrode and the second electrode shift from a reference potential of a voltage applied to the control electrode by a certain voltage,
wherein the charge trap region comprises SiN,
wherein a thickness of the charge trap region is not less than 1 nanometer and not more than 4 nanometers, and
wherein a composition ratio of Si to a composition ratio of N in the SiN is not less than 0.85 and not more than 0.95.

4. The device according to claim 1, wherein the char trap region comprises an oxide dielectric of Ti, Zr, or Hf to which at least one selected from the group consisting of Tc, Re, Ru, Os, Rh, Ir, Pd, Pt, Co, Ni, W, Mo, Cr, Mn, and Fe is added.

5. The device according to claim 4, wherein at least one selected from the group consisting of N, C, B, Mg, Ca, Sr, Ba, Al, Sc, Y, and La is added to the oxide dielectric.

6. The device according to claim 4, wherein the oxide dielectric is provided in a clustered form in the insulating film.

7. The device according to claim 1, wherein the charge trap region contacts the control electrode.

8. The device according to claim 1, wherein a work function of a material of the control electrode is substantially equal to a mid gap of silicon.

9. The device according to claim 1, wherein the second electrode is provided on a second surface on an opposite side to the first surface of the structure.

10. The device according to claim 1, further comprising a voltage supplying unit applying the bias voltage to the first electrode and the second electrode.

11. The device according to claim 1, wherein the shift voltage is not less than 1 volt and not less than 5 volts.

12. The device according to claim 1, wherein the structure comprises SiC.

13. The device according to claim 1, wherein the SiN physically contacts the control electrode.

* * * * *